(12) United States Patent
Lee et al.

(10) Patent No.: US 9,087,871 B2
(45) Date of Patent: Jul. 21, 2015

(54) NONVOLATILE MEMORY DEVICES AND METHODS OF FABRICATING THE SAME

(71) Applicants: Kil-Ho Lee, Hwaseong-si (KR); Ki-Joon Kim, Hwaseong-si (KR); Se-Woong Park, Seoul (KR)

(72) Inventors: Kil-Ho Lee, Hwaseong-si (KR); Ki-Joon Kim, Hwaseong-si (KR); Se-Woong Park, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 61 days.

(21) Appl. No.: 13/946,307

(22) Filed: Jul. 19, 2013

(65) Prior Publication Data
US 2014/0038385 A1     Feb. 6, 2014

(30) Foreign Application Priority Data
Aug. 6, 2012 (KR) .......................... 10-2012-0085784

(51) Int. Cl.
*H01L 21/311* (2006.01)
*H01L 21/762* (2006.01)
*H01L 21/768* (2006.01)
*H01L 27/22* (2006.01)
*H01L 43/08* (2006.01)

(52) U.S. Cl.
CPC .... *H01L 21/76224* (2013.01); *H01L 21/76805* (2013.01); *H01L 21/76808* (2013.01); *H01L 21/76831* (2013.01); *H01L 21/76832* (2013.01); *H01L 27/228* (2013.01); *H01L 43/08* (2013.01)

(58) Field of Classification Search
CPC ................... H01L 21/76224; H01L 21/76805; H01L 21/76808; H01L 21/76831; H01L 21/76832; H01L 27/228

USPC .......................................................... 438/740
See application file for complete search history.

(56) References Cited

U.S. PATENT DOCUMENTS

| | | | |
|---|---|---|---|
| 6,541,324 B1 * | 4/2003 | Wang ............................. | 438/201 |
| 7,141,842 B2 | 11/2006 | Kajiyama | |
| 7,919,407 B1 | 4/2011 | Zhong et al. | |
| 2005/0121710 A1 * | 6/2005 | Shino .............................. | 257/296 |
| 2010/0193850 A1 * | 8/2010 | Asao et al. ..................... | 257/295 |
| 2010/0224925 A1 * | 9/2010 | Ching et al. ................... | 257/301 |
| 2011/0049657 A1 | 3/2011 | Tsukamoto et al. | |
| 2011/0062539 A1 | 3/2011 | Matsuda et al. | |
| 2011/0089507 A1 | 4/2011 | Mao | |
| 2011/0101478 A1 | 5/2011 | Zhong et al. | |
| 2011/0129946 A1 | 6/2011 | Zhong et al. | |

FOREIGN PATENT DOCUMENTS

| | | | |
|---|---|---|---|
| JP | 2009283843 A | 12/2009 | |
| KR | 2000-0051680 A | 8/2000 | |
| KR | 10-0386455 B1 | 6/2003 | |

* cited by examiner

*Primary Examiner* — Nicholas Tobergte
(74) *Attorney, Agent, or Firm* — Harness, Dickey & Pierce, P.L.C.

(57) ABSTRACT

Nonvolatile memory devices and methods of fabricating the same, include, forming a transistor in a first region of a substrate, forming a contact which is connected to the transistor, forming an information storage portion, which is disposed two-dimensionally, in a second region of the substrate, sequentially forming a stop film and an interlayer insulating film which cover the contact and the information storage portion, forming a first trench, which exposes the stop film, on the contact, and forming a second trench which extends through the stop film to expose the contact, wherein a bottom surface of the first trench is lower than a bottom surface of the information storage portion.

18 Claims, 9 Drawing Sheets

NONVOLATILE MEMORY DEVICES AND METHODS OF FABRICATING THE SAME

PRIORITY

This application claims priority under 35 U.S.C. §119 from Korean Patent Application No. 10-2012-0085784 filed on Aug. 6, 2012 in the Korean Intellectual Property Office, the disclosure of which is incorporated herein by reference in its entirety.

BACKGROUND

1. Field of the Invention

Example embodiments relate to nonvolatile memory devices and methods of fabricating the same.

2. Description of the Related Art

Examples of nonvolatile memories using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

Semiconductor products are increasingly becoming smaller in volume but are required to process high-volume data. Therefore, it is required to increase the operation speed and integration density of memory devices used in these semiconductor products. To meet these demands, an MRAM which implements a memory function using a change in resistance with respect to a change in the polarity of a magnetic material has been suggested and is being intensively researched.

SUMMARY

Example embodiments relate to nonvolatile memory devices and methods of fabricating the same.

Example embodiments provide a method of fabricating a nonvolatile memory device, the method being employed to increase a thickness of a bit line in a peripheral region and ensure a short margin between the bit line and a gate pattern disposed under the bit line.

Example embodiments also provide a nonvolatile memory device fabricated using the above method.

However, Example embodiments are not restricted to the one set forth herein. The above and other example embodiments will become more apparent to one of ordinary skill in the art by referencing the detailed description given below.

According to example embodiments, there is provided a method of fabricating a nonvolatile memory device, the method comprising, forming a transistor in a first region of a substrate, forming a contact connected to the transistor, forming an information storage portion disposed two-dimensionally and in a second region of the substrate, sequentially forming a stop film and an interlayer insulating film covering the contact and the information storage portion, forming a first trench exposing the stop film and on the contact, and forming a second trench extending through the stop film to expose the contact, wherein a bottom surface of the first trench is lower than a bottom surface of the information storage portion.

The second trench may be formed after the first trench is formed, and the first trench may be wider than the second trench.

The forming of the first trench may include patterning the interlayer insulating film, and the forming of the second trench may include at least partially filling the first trench with a filler, and patterning the filler and the stop film.

The method may further include forming a blocking pattern in the first region and covering the contact, after the forming of the contact and prior to the forming of the information storage portion.

The forming of the stop film may include removing the blocking pattern, and then sequentially forming a lower stop film and an upper stop film to cover the information storage portion. The lower stop film may be conformally formed on the information storage portion.

The forming of the stop film may further include forming an oxide film between the lower stop film and the upper stop film.

A step may be formed between a top surface of the stop film in the first region and a top surface of the stop film in the second region.

The method may further include forming a third trench in the interlayer insulating film and exposing the information storage portion.

The first trench and the second trench may be formed after the forming of the third trench.

The method may further include forming a via in the second trench and contacting the contact, forming a first bit line in the first trench and connected to the via, and forming a second bit line in the third trench and connected to each of the information storage portions.

According to other example embodiments, there is provided a method of fabricating a nonvolatile memory device, the method comprising, forming a transistor in a first region of a substrate, forming a contact connected to the transistor, forming a stop film in the first region and covering the contact, forming an information storage portion disposed two-dimensionally and in a second region of the substrate, after the forming of the stop film, forming an interlayer insulating film covering the contact and the information storage portion, forming a first trench exposing the stop film and on the contact, and forming a second trench extending through the stop film to expose the contact.

The second trench may be formed after the first trench is formed, and the first trench may be wider than the second trench.

The forming of the first trench may include patterning the interlayer insulating film, and the forming of the second trench may include at least partially filling the first trench with a filler, and patterning the filler and the stop film.

The method may further include forming a third trench exposing the information storage portion and in the interlayer insulating film.

The first trench and the second trench may be formed after the forming of the third trench.

According to yet further example embodiments, there is provided a method of fabricating a nonvolatile memory device, the method comprising, forming a transistor in a first region of a substrate, forming a contact connected to the transistor, and forming an insulated information storage-stop structure over the contact and the transistor by sequentially forming a base layer, at least one intermediate layer, and a top layer. One of the base layer and the at least one intermediate layer includes a stop film covering the contact, and the other of the base layer and the at least one intermediate layer includes an information storage portion disposed two-dimensionally in a second region of the substrate. The top layer includes an interlayer insulating film covering the contact and the information storage portion. The method further includes forming a first trench exposing the stop film, wherein the first trench is on the contact, and forming a second trench extending through the stop film to expose the contact.

The stop film may be included the base layer and covers the contact in the first region.

The base layer may include the information storage portion, and a bottom surface of the first trench may be lower than a bottom surface of the information storage portion.

The method may further include forming a via in the second trench and contacting the contact, wherein the via and the stop film covering the contact have substantially the same height, and a bottom surface of the second trench is lower than a bottom surface of the first trench.

The method may further include forming a bit line in the first trench and contacting the stop film.

BRIEF DESCRIPTION OF THE DRAWINGS

The above and other features will become more apparent by describing in detail example embodiments thereof with reference to the attached drawings, in which.

DETAILED DESCRIPTION OF EXAMPLE EMBODIMENTS

Figure 1:
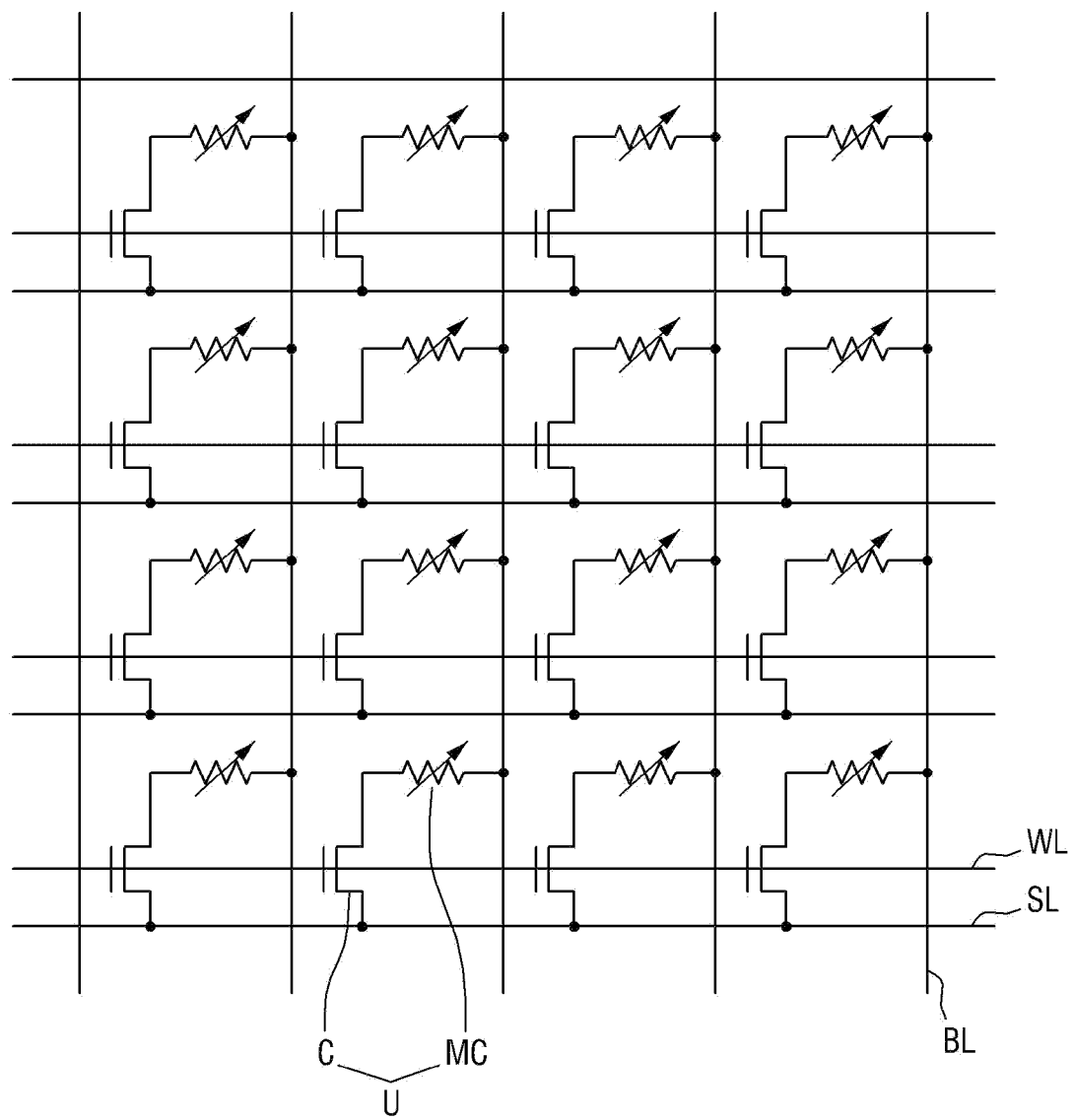
FIG. 1 is an equivalent circuit diagram of a nonvolatile memory device according to example embodiments.

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to nonvolatile memory devices and a methods of fabricating the same.

Hereinafter, example embodiments will be described using a magnetic random access memory (MRAM). However, it is obvious to those of ordinary skill in the art that the disclosure can be applied to all nonvolatile memories using resistance materials, such as resistive RAMs (RRAMs) and phase-change RAMs (PRAMs).

Figure 2:
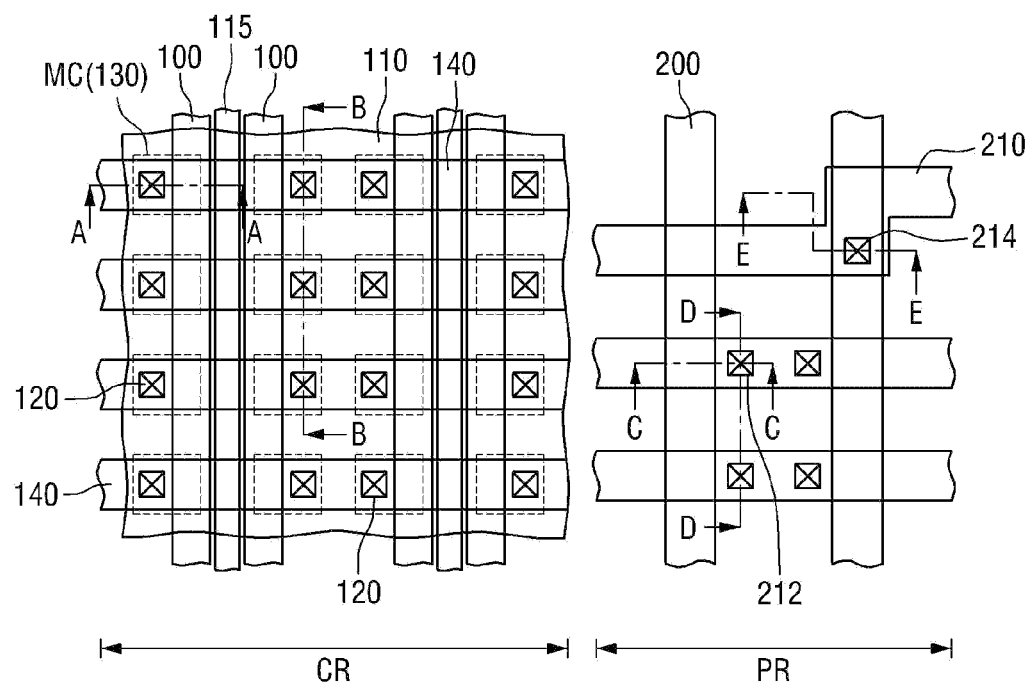
FIG. 2 is a plan view of the nonvolatile memory device.
Figure 3:
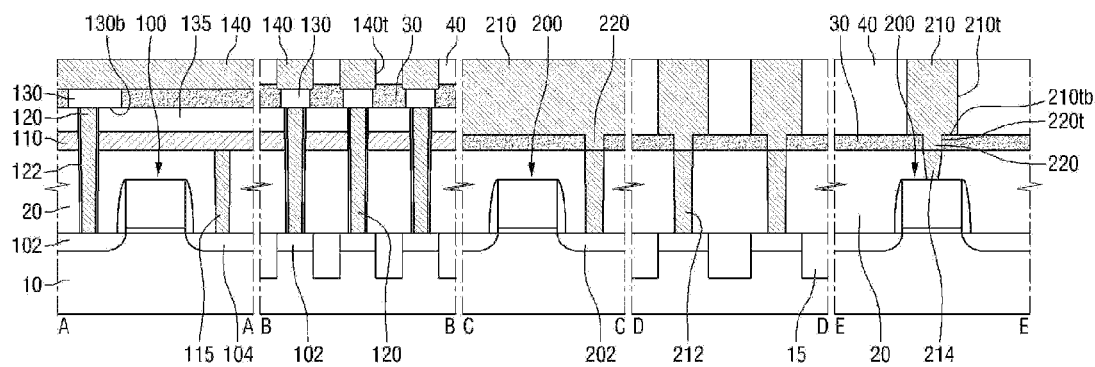
FIG. 3 is a cross-sectional view taken along the lines A-A, B-B C-C, D-D and E-E of FIG. 2.

FIG. 1 is an equivalent circuit diagram of a nonvolatile memory device according to example embodiments. FIG. 2 is a plan view of the nonvolatile memory device. FIG. 3 is a cross-sectional view taken along the lines A-A, B-B C-C, D-D and E-E of FIG. 2.

Referring to FIG. 1, an MRAM array includes a plurality of MRAM unit cells U arranged in a matrix. Each of the MRAM unit cells U includes an access part C and a memory cell MC. Each of the MRAM unit cells U is electrically connected to a word line WL and a bit line BL. If the access part C is a transistor as shown in FIG. 1, a source line SL electrically connected to a source region of the access part C may further be provided. In FIG. 1, one access part C is connected to one source line SL. However, a plurality of access portions C can also be connected to one source line SL. The word line WL and the bit line BL may be arranged two-dimensionally at a set angle (e.g., a right angle to each other). In addition, the word line WL and the source line SL may be arranged at a set angle to each other, for example, may be arranged parallel to each other.

The access part C controls the supply of current to the memory cell MC according to a voltage of the word line WL. The access part C may be a metal oxide semiconductor (MOS) transistor, a bipolar transistor, or a diode.

The memory cell MC may include a magnetic material and include a magnetic tunnel junction (MTJ). In addition, the memory cell MC may perform a memory function using a spin transfer torque (STT) phenomenon in which a magnetization direction of a magnetic material is changed by an input current.

Referring to FIGS. 2 and 3, a substrate 10 may include a first region CR and a second region PR. The first region CR may be a cell region where memory cells are formed. The second region PR may be a peripheral circuit region where circuits related to the operation of memory cells are formed. The substrate 10 may include a semiconductor layer made of silicon (Si), silicon germanium (SiGe) and/or silicon carbide (SiC), a conductive layer containing titanium (Ti), titanium nitride (TiN), aluminum (Al), tantalum (Ta), tantalum nitride (TaN) and/or titanium aluminum nitride (TiAlN), and/or a dielectric layer containing silicon oxide, titanium oxide, aluminum oxide, zirconium oxide and/or hafnium oxide. In addition, the substrate 10 may include an epitaxial layer, a silicon-on-insulator (SOI) layer, and/or a semiconductor-on-insulator (SEOI) layer. The substrate 10 may include a conductive line or other semiconductor devices.

The substrate 10 may be a substrate doped with first impurities. For example, the substrate 10 may be a p-type silicon substrate lightly doped with p-type impurities. The first region CR and the second region PR described below refer to portions of the substrate 10.

A plurality of memory cells MC may be formed in the first region CR. The memory cells MC may be arranged two-dimensionally on the substrate 10. Each of the memory cells MC may include an information storage portion 130 and a switching device. Each of the memory cells MC may be a magnetic memory cell which includes an MTJ. The information storage portion 130 will be described in more detail later with reference to FIGS. 4 and 5.

The switching device included in each of the memory cells MC of the first region CR may be, for example, a MOS transistor. Referring to FIG. 3, a first transistor 100 may be formed in the first region CR. The first transistor 100 may include, for example, a gate electrode and source/drain regions 102 and 104. The first transistor 100 may include a gate insulating film (that contains an oxide) between the gate electrode and the substrate 10. The first transistor 100 may extend in a second direction y and extend over a plurality of active regions separated by device isolation regions 15. The gate electrode of the first transistor 100 may include a doped semiconductor and/or a metal material. The first transistor 100 may further include a spacer which includes at least one of an oxide film, an oxynitride film, and a nitride film.

Referring to FIGS. 2 and 3, the source/drain regions 102 and 104 in the first region CR may include a first source/drain region 104 which is in contact with one contact 115 shared by adjacent transistors and a second source/drain region 102 which is in contact with one contact 120 formed in each transistor.

A conductive pattern 110 may be disposed in the first region CR. The conductive pattern 110 may be disposed only in the first region CR. The conductive pattern 110 may be electrically connected to the first source/drain region 104. That is, the conductive pattern 110 may be commonly connected to the first source/drain regions 104 of the first transistors 100. The conductive pattern 110 may be separated from the first transistor 100 by a first interlayer insulating film 20. The conductive pattern 110 may be shaped like a flat plate that covers the first transistor 100 of the first region CR. Because the conductive pattern 110 shaped like a flat plate has a wide area, a resistance value thereof can be minimized. Therefore, the conductive pattern 110 can stably provide a reference voltage to the first transistor 100 during a read and/or program operation. While the conductive pattern 110 is shaped like a flat plate in the current example embodiments, the shape of the conductive pattern 110 is not limited to the flat plate. That is, the conductive pattern 110 connected to the first source/drain region 104 can have any shape as long as it can provide a voltage to the first transistor 100 in a stable manner.

The conductive pattern 110 may include at least one of a doped semiconductor material, a metal, a conductive metal nitride, and a metal-semiconductor compound. The conductive pattern 110 may be a single layer or a multilayer. The first interlayer insulating film 20 may be formed on the entire substrate 10 and may be, but is not limited to, an oxide film or an oxynitride film.

The first contact 115 may electrically connect the conductive pattern 110 to the first source/drain region 104 of the first transistor 100. The first contact 115 may penetrate (or extend though) the first interlayer insulating film 20 to contact the first source/drain region 104. The first contact 115 may extend substantially parallel to the first transistor 100 along the second direction y. As described above, the first contact 100 is shared by adjacent first transistors 100. Therefore, a voltage may be provided to two first transistors 100 through one first contact 115. The first contact 115 may include at least one of a doped semiconductor material, a metal, a conductive metal nitride, and a metal-semiconductor compound.

A second interlayer insulating film 135 may be disposed between the information storage portion 130 and the conductive pattern 110. The second interlayer insulating film 135 may be provided to prevent an electrical short circuit between the conductive pattern 110 and the information storage portion 130. Therefore, the second interlayer insulating film 135 may be provided only in the first region CR but not in the second region PR.

The information storage portion 130 may be disposed on the second interlayer insulating film 135 of the first region CR. Each information storage portion 130 may be separated from another information storage portion 130 by a stop film 30. The reason why each information storage portion 130 is separated from another information storage portion 130 by the stop film 30 will be described in detail later with reference to FIGS. 9A and 9B. The information storage portion 130 may be electrically connected to the second source/drain region 102 by the second contact 120. The second contact 120 may be disposed on the second source/drain region 102 corresponding to each of the memory cells MC. The second contact 120 may penetrate the first and second interlayer insulating films 20 and 135 and the conductive pattern 110 to contact the second source/drain region 102. The second contact 120 may be electrically insulated from the conductive pattern 110 by a second contact insulating film 122.

The second contact 120 may include at least one of a doped semiconductor material, a metal, a conductive metal nitride, and a metal-semiconductor compound. The second contact insulating film 122 may be, for example, an oxide, a nitride, or an oxynitride. The second interlayer insulating film 135 may be, but is not limited to, an oxide film or an oxynitride film. The stop film 30 will be described later in relation to the second region PR.

A first bit line 140 may be disposed on the information storage portion 130 and may be connected to the information storage portion 130. The first bit line 140 may extend in a first direction x. Therefore, the first bit line 140 may contact top surfaces of all information storage portions 130 arranged along the first direction x. The first bit line 140 may be disposed in a first trench 140t which penetrates a third interlayer insulating film 40 to expose the information storage portion 130. The first bit line 140 may include at least one of a metal and a conductive metal nitride, specifically, may include copper (Cu). The third interlayer insulating film 40 having the first bit line 140 therein may be formed on the entire substrate 10. However, a thickness of the third interlayer insulating film 40 in the first region CR may be different from that of the third interlayer insulating film 40 in the second region PR.

Referring to FIGS. 2 and 3, a second transistor 200 may be disposed in the second region PR. The second transistor 200 may include a gate electrode, a gate insulating film formed between the gate electrode and the substrate 10, a spacer and a third source/drain region 202 formed on sides of the gate electrode. The second transistor 200 of the second region PR may occupy a larger area of the substrate 10 than the first transistor 100 of the first region CR. In FIG. 2, a second bit line 210 of the second region PR is substantially parallel and orthogonal to the second transistor 200. However, this is merely for ease of description and not intended to be limiting.

The first interlayer insulating film 20 which covers the second transistor 200 is formed over the first region CR and the second region PR. The first interlayer insulating film 20 of the first region CR may have substantially the same thickness as the first interlayer insulating film 20 of the second region PR.

Each of third contacts 212 and 214 may be disposed on the second transistor 200 and may be connected to the second transistor 200. The third contacts 212 and 214 may penetrate the first interlayer insulating film 20 to contact the third source/drain region 202 and a top surface of the gate electrode of the second transistor 200. Top surfaces of the third contacts 212 and 214 may be at substantially the same height as a top surface of the first contact 115. However, the top surfaces of the third contacts 212 and 214 may be lower than a top surface of the second contact 120. This difference in height is attributable to the conductive pattern 110 and the second interlayer insulating film 135. A diameter or width of each of the third contacts 212 and 214 may be greater than a diameter or width of the first contact 115 and a diameter or width of the second contact 120. An ohmic layer, which includes, e.g., metal silicide, may be disposed between the first through third contacts 115, 120 and 212 and the impurity regions 102, 104 and 202. However, if the gate electrode of the second transistor is a metal-containing material, the ohmic layer may not be provided between the gate electrode of the second transistor 200 and the third contact 214.

A second trench 220t may be formed in the stop film 30 on the first interlayer insulating film 20. The second trench 220t may be disposed on each of the third contacts 212 and 214 and expose the top surface of each of the third contacts 212 and 214. That is, at least part of a bottom surface of the second trench 220t may overlap each of the third contacts 212 and 214. Each second trench 220t may be separated from another second trench 220t by the stop film 30. Thus, when seen in a plan view, the second trench 220t may look like an island within the stop film 30 of the second region PR.

A via 220 is disposed on each of the third contacts 212 and 214 and connected to each of the third contacts 212 and 214. The via 220 is disposed in the second trench 220t and surrounded by the stop film 30. The via 220 may include at least one of a metal or a conductive metal nitride, specifically, may include copper.

A third trench 210t may be formed in the third interlayer insulating film 40 on the stop film 30. The third trench 210t may be disposed on the via 220 to expose the stop film 30 and expose a top surface of the via 220. That is, a portion of a bottom surface 210tb of the third trench 210t may be the stop film 30, and the other portion of the bottom surface 210tb of the third trench 210t may be the via 220. The second trench 220t may be formed on the bottom surface 210tb of the third trench 210t. When seen in a plan view, the second trench 220t may be substantially completely overlapped by the third trench 210t. Unlike the second trench 220t, the third trench 210t may extend in the first direction x or the second direction y and, when seen in a plan view, may be shaped like a line having a width.

The bottom surface 210tb of the third trench 210t may be lower than a bottom surface 130b of the information storage portion 130 of the first region CR. This is because a thickness of the stop film 30 on the first interlayer insulating film 20 in the second region PR is smaller than the sum of a thickness of the second interlayer insulating film 135 and a thickness of the conductive pattern 110 in the first region CR.

A height of the second trench 220*t* may be smaller than that of the third trench 210*t*. For example, a ratio of the height of the second trench 220*t* to the height of the third trench 210*t* may be equal to or greater than 1:8. That is, as a vertical thickness of the nonvolatile memory device according to example embodiments is reduced, the ratio of the height of the second trench 220*t* to the height of the third trench 210*t* may have a value greater than 1:8. However, if the sum of the thicknesses of the conductive pattern 110, the second interlayer insulating film 135, the information storage portion 130, and the first bit line 140 in the first region CR is reduced, the ratio of the height of the second trench 220*t* to the height of the third trench 210*t* may have a value less than 1:8.

The second bit line 210 is disposed in the third trench 210*t* which exposes the stop film 30 and the via 220. The second bit line 210 may be connected to the via 220. The second bit line 210 may include at least one of a metal and a conductive metal nitride, specifically, may include copper. The first bit line 140, the second bit line 210, and the via 220 may be made of the same material, specifically, copper. The first bit line 140 and the second bit line 210 have different thicknesses. However, a top surface of the first bit line 140 may be at substantially the same height as a top surface of the second bit line 210.

As the thickness of the second bit line 210 increases, a resistance value of the second bit line 210 decreases, thereby increasing the operation speed. However, as the distance between the second bit line 210 and each of the third contacts 212 and 214 decreases, a short margin between the second transistor 200 and the second bit line 210 is reduced. If the short margin is reduced, even a small process change can cause the second bit line 210 and each of the third contacts 212 and 214 to short-circuit, thus reducing the reliability of the nonvolatile memory device. For this reason, the via 220 is provided between the second bit line 210 and each of the third contacts 212 and 214. Here, a thickness of the via 220 is minimized to ensure the reliability of the nonvolatile memory device according to example embodiments while improving operating characteristics of the nonvolatile memory device.

Further, because a height of the via 220 can be adjusted by adjusting the thickness of the stop film 30, the integration density of the nonvolatile memory device in a vertical direction can be increased by reducing the thickness of the stop film 30.

The information storage portion 130 of the nonvolatile memory device shown in FIG. 2 will now be described in greater detail with reference to FIGS. 4 and 5.

Figure 4:
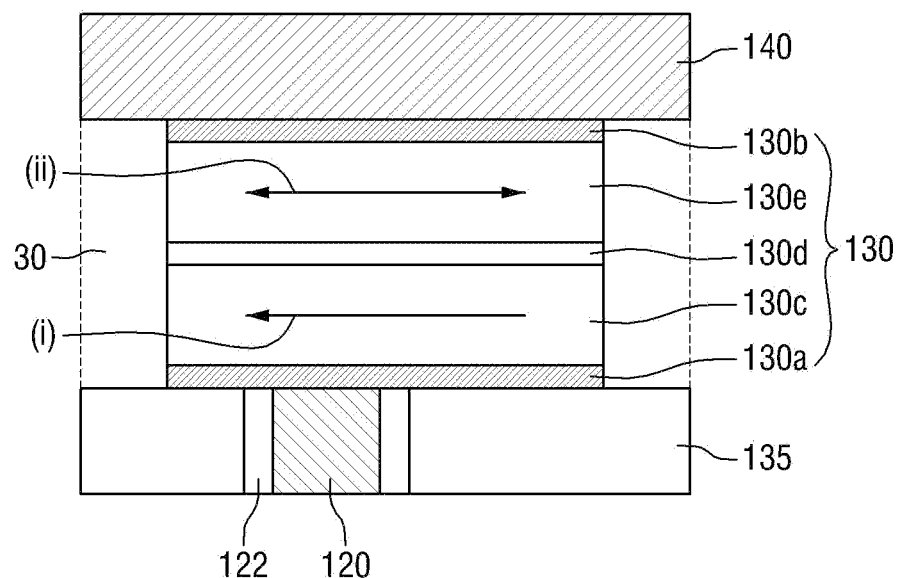
FIG. 4 is a cross-sectional view of an example information storage portion (or device) of the nonvolatile memory device shown in FIG. 2.

FIG. 4 is a cross-sectional view of an example information storage portion (or device) of the nonvolatile memory device shown in FIG. 2. FIG. 5 is a cross-sectional view of another example information storage portion (or device) of the nonvolatile memory device shown in FIG. 2.

Referring to FIG. 4, an information storage portion 130 according to the current example embodiments may include a reference pattern 130*c*, a free pattern 130*e*, and a tunnel barrier pattern 130*d* disposed between the reference pattern 130*c* and the free pattern 130*e*. The reference pattern 130*c* has a magnetization direction i pinned in a direction, and the free pattern 130*e* has a magnetization direction ii which can be changed to a direction parallel or semi-parallel to the magnetization direction i of the reference pattern 130*c*. The magnetization directions i and ii of the reference pattern 130*c* and the free pattern 130*e* may be parallel to a surface of the tunnel barrier pattern 130*d* which is in contact with the free pattern 130*e*. The reference pattern 130*c*, the tunnel barrier pattern 130*d* and the free pattern 130*e* may form an MTJ.

If the magnetization direction ii of the free pattern 130*e* is parallel to the magnetization direction i of the reference pattern 130*c*, the information storage portion 130 may have a first resistance value. If the magnetization direction ii of the free pattern 130*e* is semi-parallel to the magnetization direction i of the reference pattern 130*c*, the information storage portion 130 may have a second resistance value. Here, the first resistance value may be smaller than the second resistance value. The magnetization direction ii of the free pattern 130*e* can be changed by spin torque of electrons in a program current.

The reference pattern 130*c* and the free pattern 130*e* may include a ferromagnetic material. The reference pattern 130*c* may further include an antiferromagnetic material (or layer) which pins a magnetization direction of the ferromagnetic material in the reference pattern 130*c*. The tunnel barrier pattern 130*d* may include at least one of magnesium oxide, titanium oxide, aluminum oxide, magnesium-zinc oxide, and magnesium-boron oxide.

The information storage portion 130 may further include a bottom electrode 130*a* and a top electrode 130*b*. The reference pattern 130*c*, the tunnel barrier pattern 130*d*, and the free pattern 130*e* may be disposed between the bottom electrode 130*a* and the top electrode 130*b*. As shown in FIG. 4, the reference pattern 130*c*, the tunnel barrier pattern 130*d*, and the free pattern 130*e* may be stacked sequentially on the bottom electrode 130*a*, and the top electrode 130*b* may be disposed on the free pattern 130*e*. Alternatively, the free pattern 130*e*, the tunnel barrier pattern 130*d*, and the reference pattern 130*c* may be stacked sequentially on the bottom electrode 130*a*. The bottom electrode 130*a* and the top electrode 130*b* may include a conductive metal nitride (e.g., titanium nitride, tantalum nitride, and/or tungsten nitride).

Figure 5:
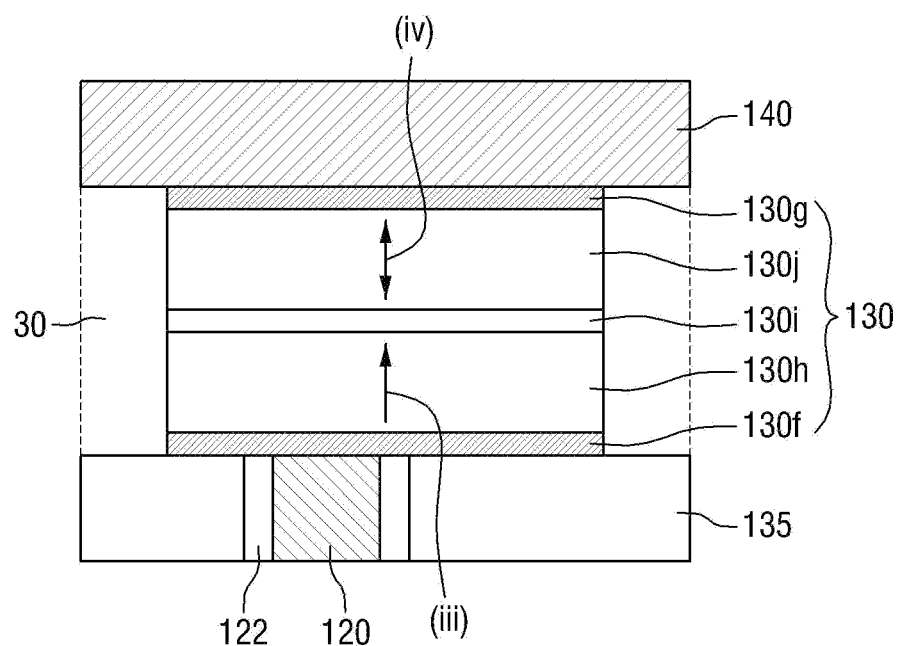
FIG. 5 is a cross-sectional view of another example information storage portion (or device) of the nonvolatile memory device shown in FIG. 2.

Referring to FIG. 5, an information storage portion 130 according to the current example embodiments may include a reference vertical pattern 130*h*, a free vertical pattern 130*j*, and a tunnel barrier pattern 130*i* inserted between the reference vertical pattern 130*h* and the free vertical pattern 130*j*. The reference vertical pattern 130*h* may have a magnetization direction iii pinned in a direction, and the free vertical pattern 130*j* may have a magnetization direction iv which can be changed to a direction parallel or semi-parallel to the pinned magnetization direction iii of the reference vertical pattern 130*h*. Here, the magnetization directions iii and iv of the reference and free vertical patterns 130*h* and 130*j* may be substantially perpendicular to a surface of the tunnel barrier pattern 130*i* which is in contact with the free vertical pattern 130*j*.

The reference vertical pattern 130*h* and the free vertical pattern 130*j* may include at least one of a vertical magnetic material (e.g., CoFeTb, CoFeGd and/or CoFeDy), a vertical magnetic material having an L10 structure, CoPt having a hexagonal close packed lattice structure, and a vertical magnetic structure. The vertical magnetic material having the L10 structure may include at least one of FePt having the L10 structure, FePd having the L10 structure, CoPd having the L10 structure, and CoPt having the L10 structure. The vertical magnetic structure may include magnetic and non-magnetic layers stacked alternately and repeatedly. For example, the vertical magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n, where n is the number of stacking times. Here, the reference vertical pattern 130*h* may be thicker than the free vertical pattern 130*j*, and coercivity of the reference vertical pattern 130*h* may be greater than that of the free vertical pattern 130*j*.

The tunnel barrier pattern 130*i* may include at least one of magnesium oxide, titanium oxide, aluminum oxide, magnesium-zinc oxide, and magnesium-boron oxide. The information storage portion 130 may include a bottom electrode 130f and a top electrode 130g. As shown in the drawing, the reference vertical pattern 130h, the tunnel barrier pattern 130i and the free vertical pattern 130j may be stacked sequentially on the bottom electrode 130f, and the top electrode 130g may be disposed on the free vertical pattern 130j. The free vertical pattern 130j, the tunnel barrier pattern 130i, and the reference vertical pattern 130h may be stacked sequentially on the bottom electrode 130f, and the top electrode 130g may be disposed on the reference vertical pattern 130h. The bottom and top electrodes 130f and 130g may be made of, e.g., a conductive metal nitride.

A method of fabricating a nonvolatile memory device according to example embodiments will now be described with reference to FIGS. 2, 3 and 6 through 14.

FIGS. 6 through 14 are cross-sectional views taken along the lines A-A, B-B, C-C, D-D and E-E of FIG. 2 and illustrating intermediate processes included in a method of fabricating a nonvolatile memory device according to example embodiments.

Figure 6:
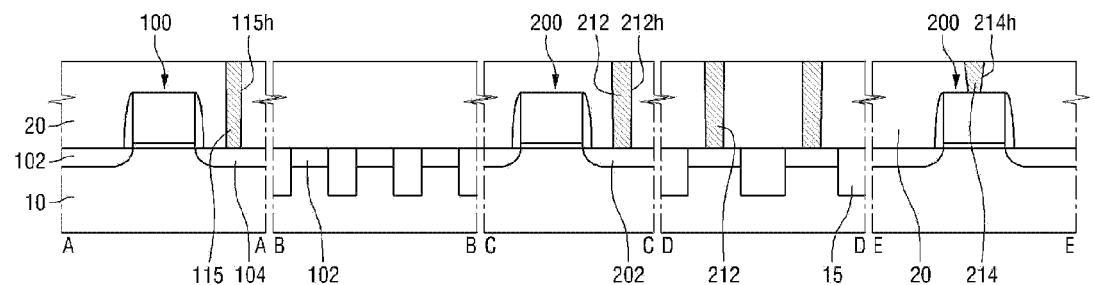
FIGS. 6 through 14 are cross-sectional views taken along the lines A-A, B-B, C-C, D-D and E-E of FIG. 2 and illustrating intermediate processes included in a method of fabricating a nonvolatile memory device according to example embodiments.

Referring to FIGS. 2 and 6, device isolation regions 15 may be formed in a substrate 10 to define active regions. The device isolation regions 15 may form trench-type device isolation patterns.

A first transistor 100 and a second transistor 200 may respectively be formed in a first region CR and a second region PR of the substrate 10. The first transistor 100 may include a first source/drain region 104 and a second source/drain region 102 formed on both sides of a spacer of the first transistor 100. The first source/drain region 104 is in contact with a first contact 115 which is shared by adjacent first transistors 100. The second source/drain region 102 is in contact with a second contact 120 (see FIG. 7) which is connected to each information storage portion 130 (see FIG. 8). The first and second source/drain regions 102 and 104 may be formed by doping the substrate 10 with impurities of an opposite conductivity type to a conductivity type of the substrate 10. The second transistor 200 may include a third source/drain region 202 formed on both sides of a spacer of the second transistor 200. The third source/drain region 202 may be formed by doping the substrate 10 with impurities of an opposite conductivity type to the conductivity type of the substrate 10.

A first interlayer insulating film 20 may be formed on the substrate 10 to cover the first transistor 100 and the second transistor 200. The first interlayer insulating film 20 may be formed by, e.g., chemical vapor deposition (CVD).

The first contact 115 connected to the first source/drain region 104 in a second direction y may be formed in the first interlayer insulating film 20 of the first region CR. Third contacts 212 and 214 connected respectively to the third source/drain region 202 and a gate electrode of the second transistor 200 may be formed in the first interlayer insulating film 20 of the second region PR.

The first contact 115 may be formed in a first contact hole 115h which penetrates the first interlayer insulating film 20 to expose the first source/drain region 104. The first contact hole 115h may be formed by forming a mask pattern (not shown) on the first interlayer insulating film 20 and patterning the first interlayer insulating film 20 using the mask pattern as an etch mask. The third contacts 212 and 214 may be formed in third contact holes 212h and 214h which penetrate the first interlayer insulating film 20 to expose the third source/drain region 202 and the gate electrode of the second transistor 200. Like the first contact hole 115h, the third contact holes 212h and 214h may be formed by patterning the first interlayer insulating film 20 of the second region PR.

The first contact 115 and the third contacts 212 and 214 may be formed by filing the first contact hole 115h and the third contact holes 212h and 214h with a conductive material and then planarizing the conductive material. The first contact 115 and the third contacts 212 and 214 may be made of a material that includes at least one of a doped semiconductor material, a metal, a conductive metal nitride, and a metal-semiconductor compound. In the planarization process performed to form the first contact 115 and the third contacts 212 and 214, a top surface of the first interlayer insulating film 20 may also be planarized.

Figure 7:
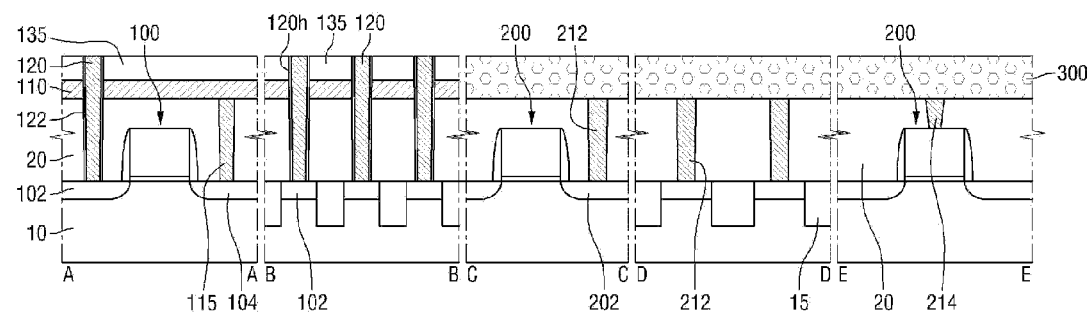

Referring to FIGS. 2 and 7, a blocking pattern 300 may be formed on the planarized first interlayer insulating film 20. The blocking pattern 300 may cover the second region PR and expose the first interlayer insulating film 20 of the first region CR. The blocking pattern 300 may be, but is not limited to, a photosensitive film pattern.

A conductive pattern 110 may be formed on the first interlayer insulating film 20 of the first region CR. In the method of fabricating a nonvolatile memory device according to the current example embodiments, a case where the flat plate-shaped conductive pattern 110 is formed on the first interlayer insulating film 20 to cover all first transistors 100 is described. The conductive pattern 110 may be formed only in the first region CR and may not be formed in the second region PR. That is, because the second region PR is covered with the blocking pattern 300, the conductive pattern 110 is formed only in the first region CR. The conductive pattern 110 may contact all first contacts 115. Therefore, the first source/drain region 104 may be electrically connected to the conductive pattern 110 by the first contact 115. The conductive pattern 110 may include at least one of a doped semiconductor material, a metal, a conductive metal nitride, and a metal-semiconductor compound. After the conductive pattern 110 is formed, a second interlayer insulating film 135 may be formed. The second interlayer insulating film 135 may be formed only in the first region CR. A top surface of the second interlayer insulating film 135 may be planarized by a planarization process. The second interlayer insulating film 135 may be made of the same material as the first interlayer insulating film 20.

Referring to FIG. 7, a second contact hole 120h which penetrates the first interlayer insulating film 20, the second interlayer insulating film 135 and the conductive pattern 110 to expose the second source/drain region 102 may be formed in the first region CR. The second contact hole 120h may be formed through a plurality of etching processes. The formation of the second contact holes 120h may result in the formation of a plurality of holes in the conductive pattern 110. A dielectric film may be conformally formed on the substrate 10 having the second contact hole 120h. The dielectric film may be etched until a bottom surface of the second contact hole 120h is exposed, thereby forming a second contact insulating film 122. The second contact insulating film 122 may be formed on inner surfaces of sidewalls of the second contact hole 120h. The second contact insulating film 122 may be formed on substantially the entire inner surfaces of the sidewalls of the second contact hole 120h.

A conductive film may be formed on the substrate 10 having the second contact insulating film 122, thereby filling the second contact hole 120h. Then, the conductive film may be planarized to form the second contact 120 in the second contact hole 120h. The second contact 120 may contact the second source/drain region 102. The second contact 120 may be insulated from the conductive pattern 110 by the second contact insulating film 122. The second contact 120 may be made of a material that includes at least one of a doped semiconductor material, a metal, a conductive metal nitride, and a metal-semiconductor compound. Specifically, the second contact 120 may include tungsten (W). The second contact insulating film 122 may be made of an oxide, a nitride, or an oxynitride.

If the conductive pattern 110 is not shaped like a flat plate, the second contact hole 120h which exposes the second source/drain region 102 may penetrate only the first interlayer insulating film 20 and the second interlayer insulating film 135. In this case, because the second contact hole 120h does not penetrate the conductive pattern 110, the second contact insulating film 122 which is designed to insulate the conductive pattern 110 from the second contact 120 may not be formed.

Figure 8:
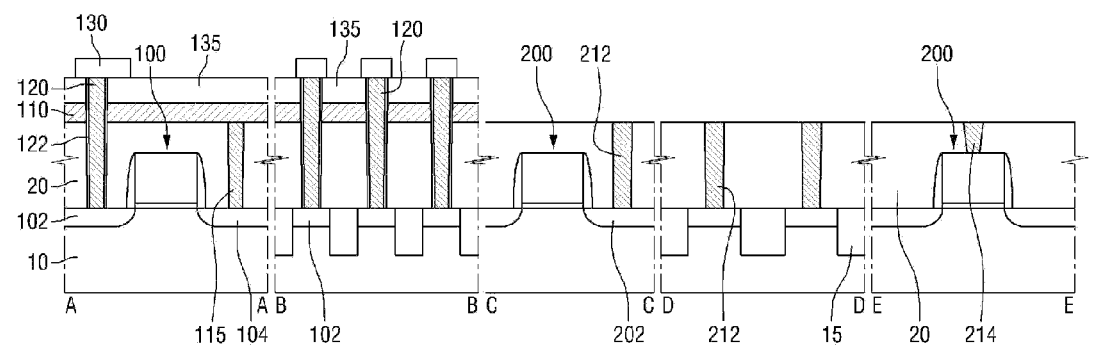

Referring to FIGS. 2 and 8, the blocking pattern 300 on the substrate 10 may be removed to expose the second region PR. Then, the information storage portion 130 may be formed on the second interlayer insulating film 135. The information storage portion 130 may be directly connected to the second contact 120. The information storage portion 130 may be formed by forming an information storage film on the second interlayer insulating film 135 and then patterning the information storage film. The information storage portions 130 may be arranged two-dimensionally along a first direction x and the second direction y. Layers that form the information storage portion 130 and a material of each layer may be identical to those described above with reference to FIGS. 4 and 5.

The blocking pattern 300 may be removed after the information storage portion 130 is formed on the second interlayer insulating film 135.

Figure 9A:
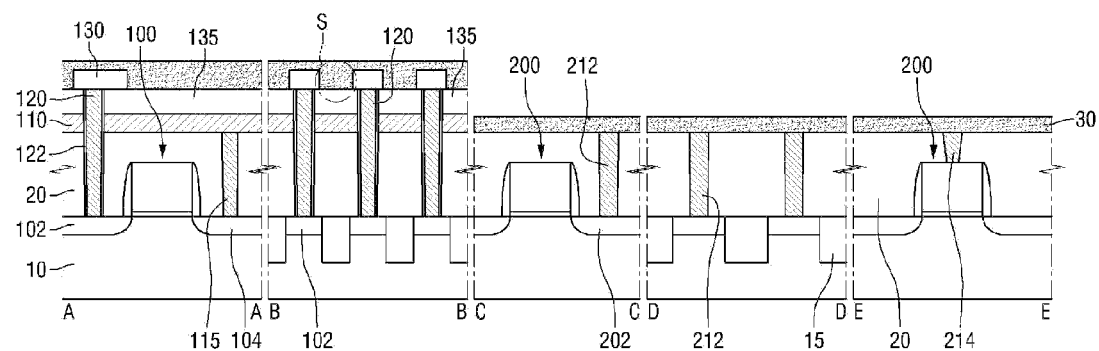
Figure 9B:
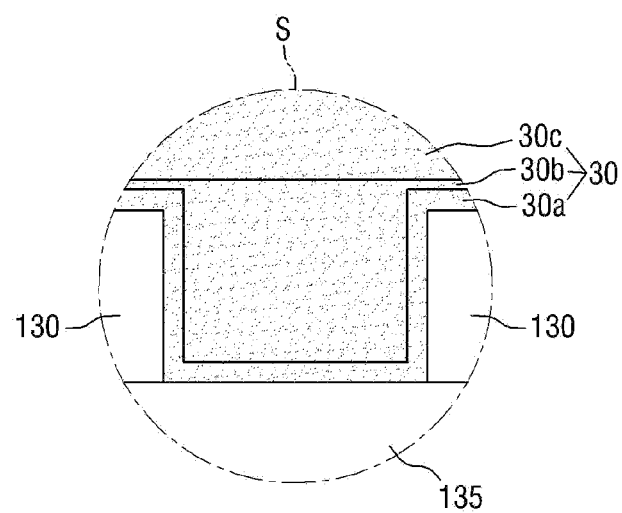

Referring to FIGS. 2, 9A and 9B, a stop film 30 may be formed on the substrate 10 to cover the third contacts 212 and 214 and the information storage portion 130. The stop film 30 may be a single layer or may consist of a plurality of layers as shown in FIG. 9B.

Specifically, a lower stop film 30a may be formed to cover the third contacts 212 and 214 and the information storage portion 130. The lower stop film 30a may help the stop film 30 completely fill a gap between the information storage portions 130. The lower stop film 30a may be conformally formed on the information storage portion 130. The lower stop film 30a may be formed by, but not limited to, atomic layer deposition (ALD). An oxide film 30b may be formed on the lower stop film 30a to fill the gap between the information storage portions 130. The oxide film 30b may include an oxide that is good for gap filling. An upper stop film 30c may additionally be formed on the oxide film 30b. The upper stop film 30c may be thicker than the lower stop film 30a. The lower stop film 30a and the upper stop film 30c should be a material having an etch selectivity with respect to a third interlayer insulating film 40 (see FIG. 10) that is to be formed on the stop film 30. The lower stop film 30a and the upper stop film 30c may include silicon nitride or silicon carbide.

The stop film 30 may be formed by sequentially stacking the lower stop film 30a, the oxide film 30b, and the upper stop film 30c on the substrate 10. The stop film 30 is formed in both the first region CR and the second region PR. Therefore, a step may be formed between a top surface of the stop film 30 in the first region CR and a top surface of the stop film 30 in the second region PR. The step of the stop film 30 may result from the conductive pattern 110, the second interlayer insulating film 135 and the information storage portion 130 formed in the first region CR but not in the second region PR. Even if the stop film 30 is formed in the first region CR and the second region PR by the same process, a thickness of the stop film 30 formed on a top surface of the information storage portion 130 may be somewhat different from that of the stop film 30 formed on the third contacts 212 and 214. The information storage portions 130 protrude upward from the second interlayer insulating film 135, and the stop film 30 should fill the gap between the information storage portions 130. This is why the stop film 30 has different thicknesses in the first region CR and the second region PR.

Figure 10:
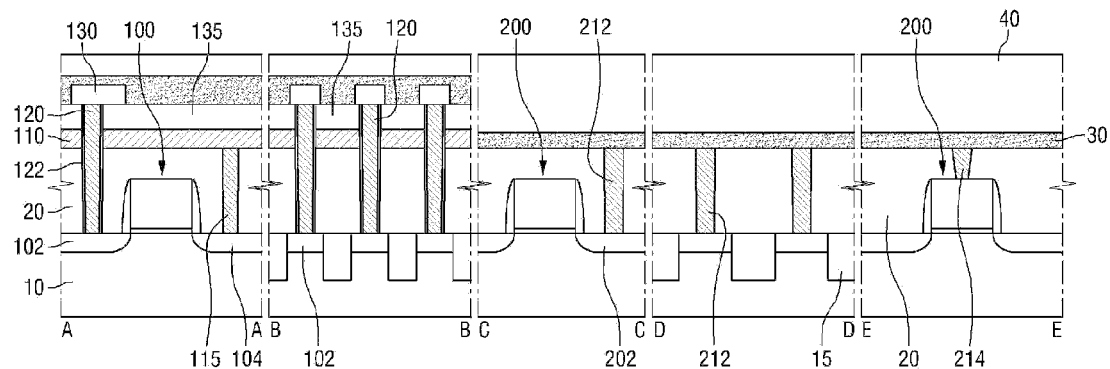

Referring to FIGS. 2 and 10, the third interlayer insulating film 40 may be formed on the substrate 10 to cover the first region CR and the second region PR. The third interlayer insulating film 40 may be formed by forming an interlayer insulating material (not shown) on the substrate 10 and planarizing the interlayer insulating material. The third interlayer insulating film 40 may be, e.g., an oxide film and may be formed by CVD. The third interlayer insulating film 40 and the stop film 30 of the second region PR are where a third trench 210t and a second trench 220t are respectively formed in a subsequent process. To form the second trench 220t and the third trench 210t, an etch selectivity between the stop film 30 and the third interlayer insulating film 40 should be high. That is, the stop film 30 may include an etch-resistant material for the third interlayer insulating film 40.

Figure 11:
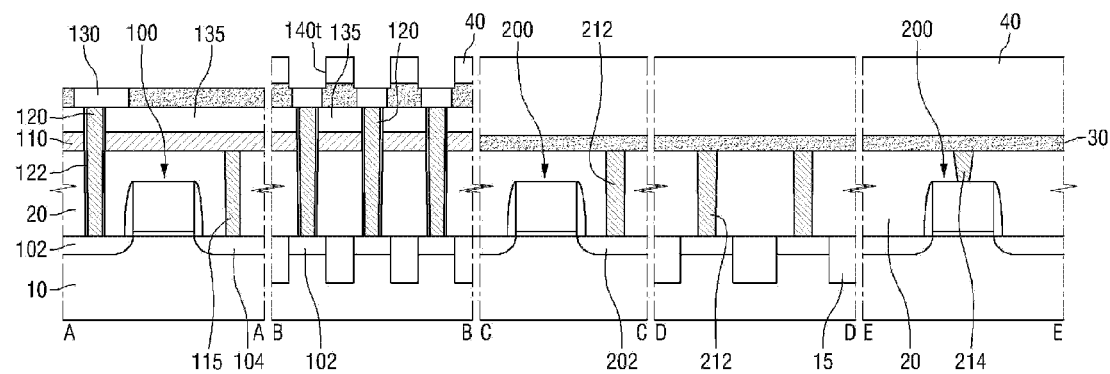

Referring to FIGS. 2 and 11, a first trench 140t which exposes the information storage portion 130 of the first region CR may be formed in the third interlayer insulating film 40. The first trench 140t may extend along the first direction x and expose all information storage portions 130 arranged along the first direction x. A depth of the first trench 140t may be greater than a thickness of the third interlayer insulating film 40 in the first region CR. This is because the stop film 30 and the third interlayer insulating film 40 are formed on the information storage portion 130.

Figure 12:
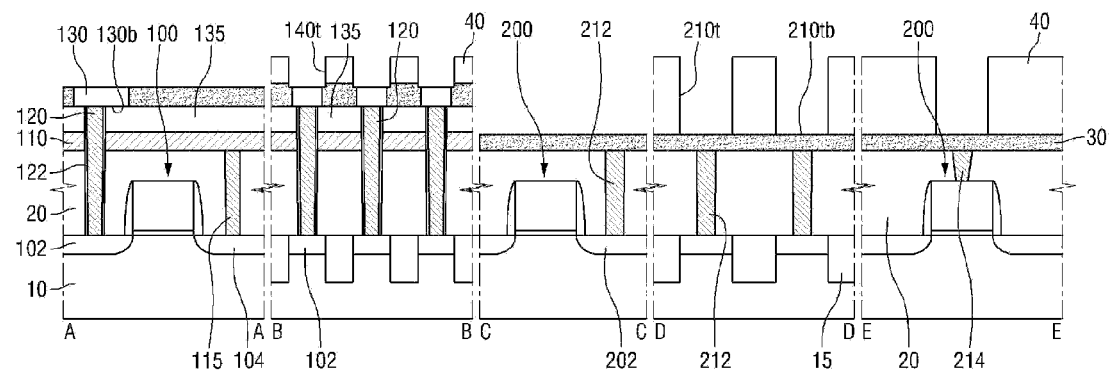

Referring to FIGS. 2 and 12, the third trench 210t may be formed in the third interlayer insulating film 40 of the second region PR. The third trench 210t is formed on each of the third contacts 212 and 214 and exposes the stop film 30. The third trench 210t may extend along the first direction x or the second direction y or may include a portion extending in the first direction x and a portion extending in the second direction y. The third trench 210t may have substantially the same thickness as the third interlayer insulating film 40 of the second region PR. This is because an etching process for forming the third trench 210t may be terminated when the stop film 30 is exposed.

A bottom surface 210tb of the third trench 210t may be formed lower than a bottom surface 130b of the information storage portion 130. This is because the thickness of the stop film 30 in the second region PR may be smaller than the sum of a thickness of the conductive pattern 110 and a thickness of the second interlayer insulating film 135 in the first region CR.

Figure 13:
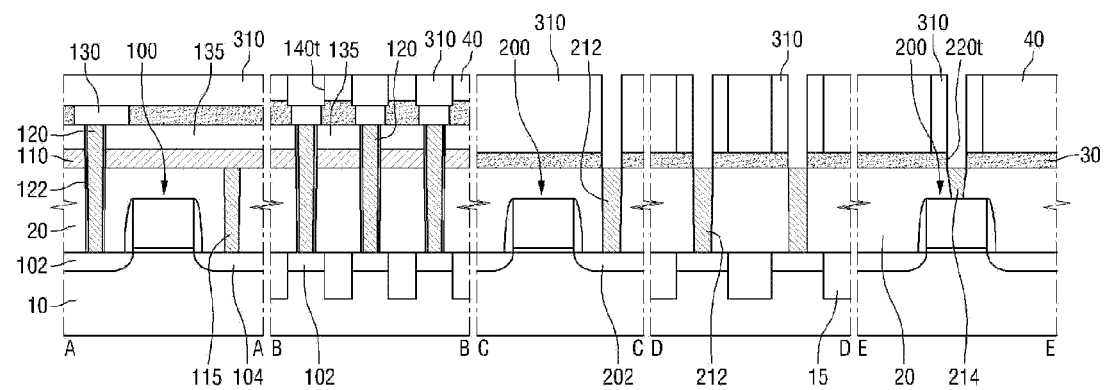

Referring to FIGS. 2 and 13, the third trench 210t on the substrate 10 may be filled with a filler 310. When the third trench 210t is filled with the filler 310, the first trench 140t may also be filled with the filler 310. However, example embodiments are not limited thereto. A mask pattern (not shown) for forming the second trench 220t is formed on the substrate 10 covered with the filler 310. Then, the filler 310 and the stop film 30 are etched sequentially using the mask pattern as an etch mask, thereby forming the second trench 220t in the second region PR. The second trench 220t may penetrate the stop film 30 and expose each of the third contacts 212 and 214. The filler 310 may include a material that can fill a narrow region due to its good gap-filling capability. For example, the filler 310 may include SOH.

Figure 14:
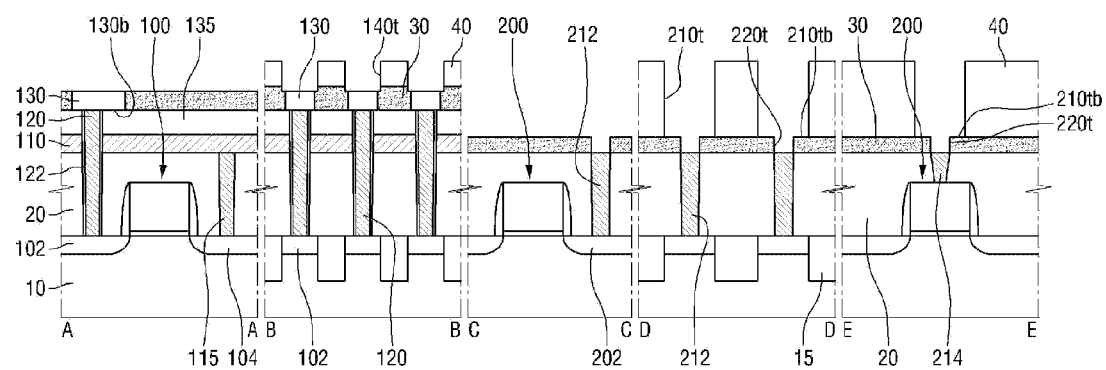

Referring to FIGS. 2 and 14, the first trench 140t which exposes the information storage portion 130 is formed in the first region CR, and the third trench 220t which exposes the stop film 30 and the second trench 220t which exposes each of the third contacts 212 and 214 are formed in the second region PR. To form the second trench 220t, the filler 310 formed on the substrate 10 is removed, thereby forming the first through third trenches 140t, 220t and 210t.

The third trench 210t may be connected to each of the contacts 212 and 214 by the second trench 220t. When seen in a plan view, the second trench 220t may be substantially completely overlapped by the third trench 210t. That is, the third trench 210t may be wider than the second trench 220t.

In FIGS. 11 through 14, the second trench 220t and the third trench 210t are formed after the first trench 140t is formed. In addition, the second trench 220t is formed after the third trench 210t, which is wider than the second trench 220t, is formed. However, the above process is merely an example used to describe the example embodiments, and the example embodiments are not limited to this process. That is, the third trench 210t can be formed after the second trench 220t, which is narrower than the third trench 210t, is formed. In addition, the second trench 220t and the third trench 210t can be formed in the second region PR before the first trench 140t is formed.

Referring to FIGS. 2 and 3, a first bit line 140 which fills the first trench 140t, a via 220 which fills the second trench 220t, and a second bit line 210 which fills the third trench 210t may be formed in the first region CR and the second region PR. The first bit line 140, the second bit line 210, and the via 220 may be formed simultaneously. That is, after a conductive material is formed in the first through third trenches 140t, 220t and 210t, a planarization process may be performed until the third interlayer insulating film 40 is exposed, thereby forming the first bit line 140, the second bit line 210, and the via 220. The first bit line 140, the second bit line 210, and the via 220 may be formed at a relatively lower temperature than the first contact 15 and the second contact 120 and may include, e.g., copper. The via 220 contacts each of the third contacts 212 and 214, the second bit line 210 is connected to the via 220, and the first bit line 140 is connected to the information storage portion 130.

A method of fabricating a nonvolatile memory device according to example embodiments will now be described with reference to FIGS. 2, 3, 15 and 16. The current example embodiments are substantially identical to the previous example embodiments, except the order of forming a stop film. Therefore, elements substantially identical to those of the previous example embodiments are indicated by like reference numerals, and thus their description will be simplified or omitted.

Figure 15:
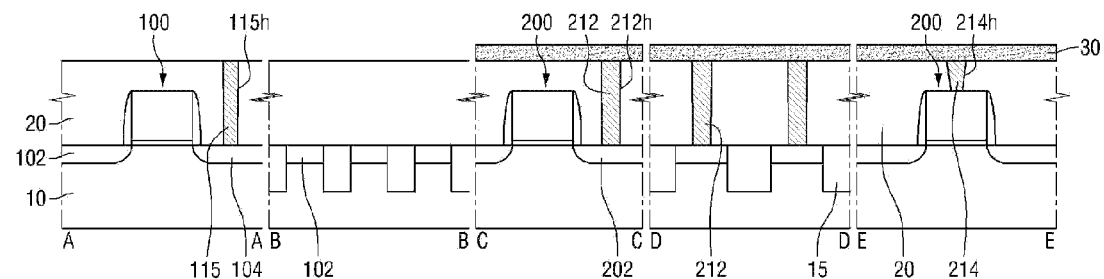
FIGS. 15 and 16 are cross-sectional views taken along the lines A-A, B-B, C-C, D-D, and E-E of FIG. 2 and illustrating intermediate processes included in a method of fabricating a nonvolatile memory device according to other example embodiments.
Figure 16:
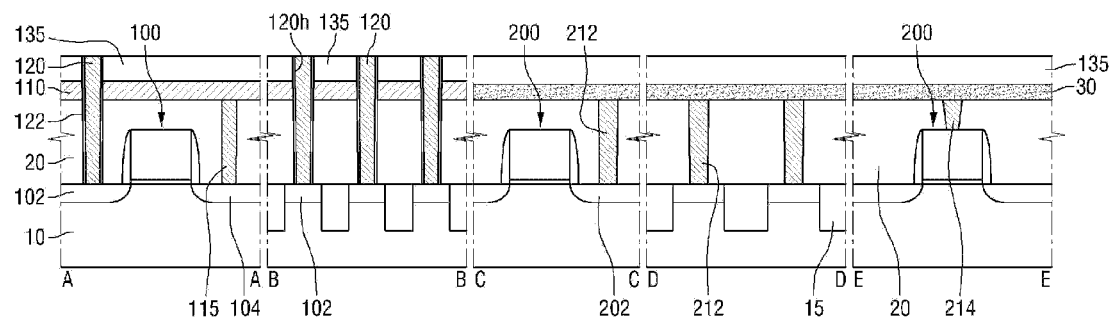

FIGS. 15 and 16 are cross-sectional views taken along the lines A-A, B-B, C-C, D-D, and E-E of FIG. 2 and illustrating intermediate processes included in a method of fabricating a nonvolatile memory device according to other example embodiments.

Referring to FIGS. 6 and 15, a stop film 30 is formed on a planarized first interlayer insulating film 20. Third contacts 212 and 214 may not exposed by the stop film 30. The stop film 30 may be formed only in a second region PR. However, example embodiments are not limited thereto.

Specifically, after the first interlayer insulating film 20 is planarized, an etch-resistant material (not shown) may be formed on a substrate 10. A mask pattern (not shown) which exposes a first region CR is formed on the etch-resistant material, and the etch-resistant material in the first region CR is removed using the mask pattern as an etch mask. As a result, the stop film 30 may be formed only in the second region PR. The stop film 30 may be a multilayer as in the above embodiment. However, because it is not necessary to fill a narrow space between information storage portions with the stop film 30, the stop film 30 may be a single layer.

Referring to FIGS. 2 and 16, a conductive pattern 110 may be formed on the first interlayer insulating film 20 of the first region CR. The conductive pattern 110 is formed only in the first region CR and not formed in the second region PR. The conductive pattern 110 may contact all first contacts 115. A first source/drain region 104 may be electrically connected to the conductive pattern 110 by the first contact 115. After the conductive pattern 110 is formed, a second interlayer insulating film 135 may be formed on the substrate 10.

Unlike the illustration in FIG. 7, the second interlayer insulating film 135 may be formed in both the first region CR and the second region PR. That is, the second interlayer insulating film 135 can also be formed on the stop film 30. The stop film 30 may be a material having an etch selectivity with respect to the second interlayer insulating film 135 in view of an etching process for forming a third trench 210t in the second region PR. The second interlayer insulating film 135 may be the same material as an insulating film which is formed on the second interlayer insulating film 135 in a subsequent process. For example, the second interlayer insulating film 135 may be an oxide film.

After the second interlayer insulating film 135 is planarized, a second contact hole 120h which penetrates the first interlayer insulating film 20, the second interlayer insulating film 135 and the conductive pattern 110 to expose a second source/drain region 102 may be formed in the first region CR. A second contact 120 may be formed by filling the second contact hole 120h with a conductive material and may contact the first source/drain region 104.

A case where the stop film 30 is formed in both the first region CR and the second region PR in FIG. 15 will now be described. After the stop film 30 is formed in both the first region CR and the second region PR, the conductive pattern 110 and the second contact 120 may be formed on the stop film 30. The second contact 120 may be formed in a second contact hole 120h which penetrates the second interlayer insulating film 135, the conductive pattern 110, the stop film 30 and the first interlayer insulating film 20.

The process of forming the information storage portion 130 and the process of forming first, second and third trenches 140t, 220t and 210t after the forming of the second contact 120 are substantially identical to those of the previous example embodiments described above, and thus a description thereof will be omitted. In the previous example embodiments, the third interlayer insulating film 40 is formed through a single deposition process. In the current example embodiments, however, a third interlayer insulating film 40 is formed through multiple deposition processes. In addition, the stop film 30 may include an etch-resistant material for an insulating film formed on the stop film 30.

The nonvolatile memory devices described in the example embodiments can be implemented as various forms of semiconductor packages. For example, the nonvolatile memory devices according to the example embodiments may be packaged using various methods such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 17:
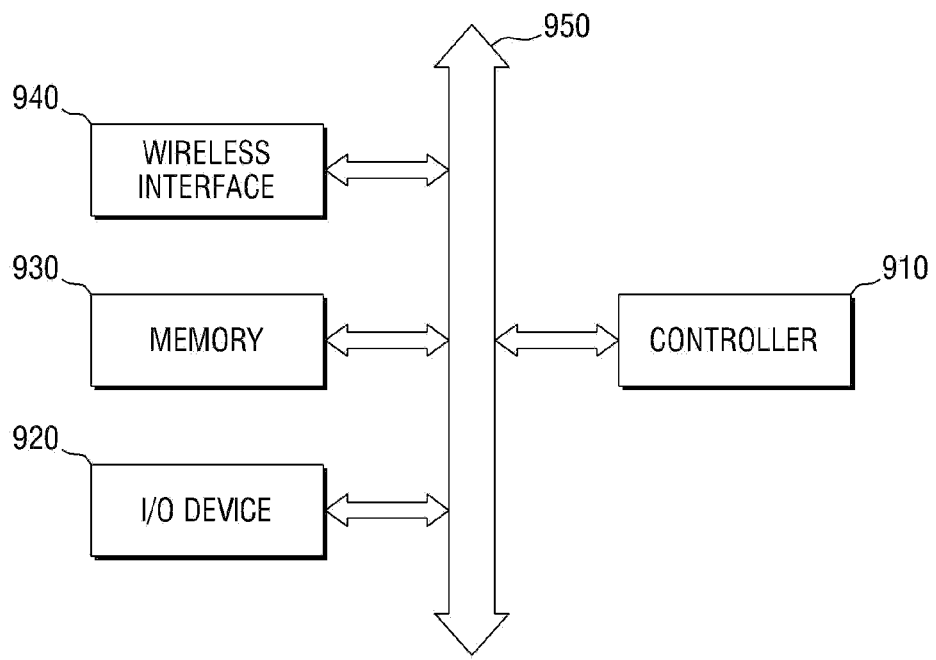
FIG. 17 is a schematic block diagram of a system including a nonvolatile memory device according to example embodiments.

FIG. 17 is a schematic block diagram of a system including a nonvolatile memory device according to example embodiments.

Referring to FIG. 17, the system 900 according to the current example embodiments may be used in wireless communication devices, e.g., personal digital assistants (PDAs), laptop computers, portable computers, web tablets, wireless phones, cell phones, digital music players or all devices capable of transmitting and/or receiving information in wireless environments.

The system 900 may include a controller 910, an input/output (I/O) device 920 such as a keypad, a keyboard and a display, a memory 930, and a wireless interface 940, which are connected to each other through a bus 950. The controller 910 may include at least one microprocessor, a digital signal processor, a microcontroller, or other similar devices. The memory 930 may be used to store a command executed by the controller 910. Also, the memory 930 may be used to store user data. The memory 930 may include a nonvolatile memory device according to various example embodiments. The memory 930 may further include other types of memories, random-accessible volatile memories, and various other types of memories.

The system 900 may use the wireless interface 940 to transmit or receive data to or from a wireless communication network using an RF signal. For example, the wireless interface 900 may include an antenna, a wireless transceiver, etc.

The system 900 according to the current example embodiments may be used as a communication interface protocol such as, for example, a next-generation communication system, e.g., CDMA (Code Division Multiple Access), GSM (Global System for Mobile communication), NADC (North American Digital Cellular), TDMA (Time Division Multiple Access), ETDMA (Extended TDMA), WCDMA (Wideband CDMA), CDMA-2000, etc. A nonvolatile memory device according to example embodiments may be applied to a memory card, which will be described below with reference to FIG. 18.

Figure 18:
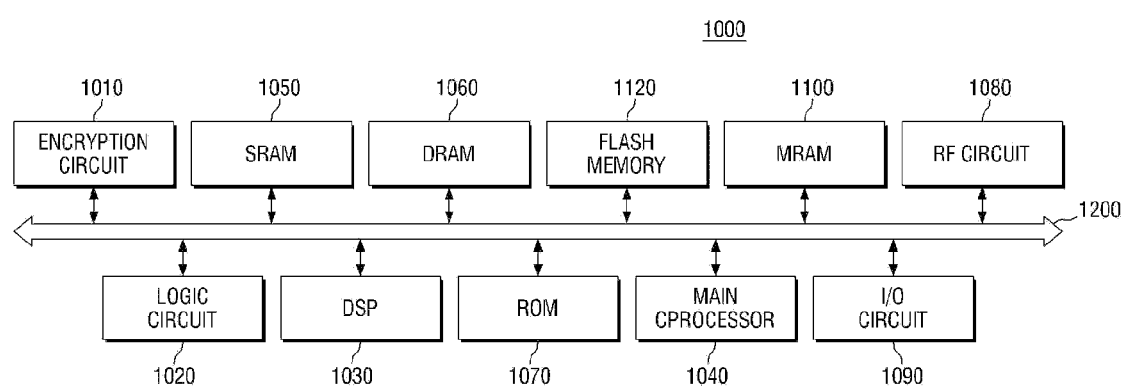
FIG. 18 is a block diagram illustrating an example structure of a memory card to which a nonvolatile memory device according to example embodiments is applied.

FIG. 18 is a block diagram illustrating a structure of a memory card to which a nonvolatile memory device according to example embodiments is applied.

Referring to FIG. 18, the memory card 1000 according to the current example embodiments may include an encryption circuit 1010, a logic circuit 1020, a digital signal processor (DSP) 1030 that is a special purpose microprocessor, and a main processor 1040. Also, the memory card 1000 may include a nonvolatile memory device 1100 according to various example embodiments and other various types of memories, e.g., an SRAM 1050, a DRAM 1060, a ROM 1070, and a flash memory 1110. In addition, the memory card 1000 may include an RF (radio frequency/microwave) circuit 1080 and an input/output (I/O) circuit 1090. Function blocks 1010 through 1120 included in the memory card 1000 may be connected to each other through a system bus 1200. The memory card 1000 may operate in compliance with the control of an external host, and the nonvolatile memory device 1100 according to example embodiments may function to store data or output stored data in compliance with the control of a host.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of fabricating a nonvolatile memory device, the method comprising:
    forming a transistor in a first region of a substrate;
    forming a contact connected to the transistor;
    forming an information storage portion disposed two-dimensionally and in a second region of the substrate;
    sequentially forming a stop film and an interlayer insulating film covering the contact and the information storage portion;
    forming a first trench on the contact and exposing the stop film, wherein the forming of the first trench includes patterning the interlayer insulating film; and
    forming a second trench extending through the stop film to expose the contact,
    wherein the forming of the second trench includes at least partially filling the first trench with a filler, and patterning the filler and the stop film, and
    wherein a bottom surface of the first trench is lower than a bottom surface of the information storage portion.

2. The method of claim 1, wherein the second trench is formed after the first trench is formed, and the first trench is wider than the second trench.

3. The method of claim 1, further comprising:
    forming a blocking pattern in the first region and covering the contact, after the forming of the contact and prior to the forming of the information storage portion.

4. The method of claim 3, wherein,
    the forming of the stop film includes removing the blocking pattern, and then sequentially forming a lower stop film and an upper stop film to cover the information storage portion, and
    the lower stop film is conformally formed on the information storage portion.

5. The method of claim 4, wherein the forming of the stop film further includes forming an oxide film between the lower stop film and the upper stop film.

6. The method of claim 4, wherein a step is formed between a top surface of the stop film in the first region and a top surface of the stop film in the second region.

7. The method of claim 1, further comprising:
    forming a third trench in the interlayer insulating film and exposing the information storage portion.

8. The method of claim 7, wherein the first trench and the second trench are formed after the forming of the third trench.

9. The method of claim 8, further comprising:
    forming a via in the second trench and contacting the contact;
    forming a first bit line in the first trench and connected to the via; and
    forming a second bit line in the third trench and connected to each of the information storage portions.

10. A method of fabricating a nonvolatile memory device, the method comprising:
    forming a transistor in a first region of a substrate;
    forming a contact connected to the transistor;
    forming a stop film in the first region and covering the contact;

forming an information storage portion disposed two-dimensionally and in a second region of the substrate, after the forming of the stop film;

forming an interlayer insulating film covering the contact and the information storage portion;

forming a first trench exposing the stop film and on the contact; and forming a second trench extending through the stop film to expose the contact.

11. The method of claim 10, wherein the second trench is formed after the first trench is formed, and the first trench is wider than the second trench.

12. The method of claim 11, wherein, the forming of the first trench includes patterning the interlayer insulating film, and the forming of the second trench includes at least partially filling the first trench with a filler, and patterning the filler and the stop film.

13. The method of claim 10, further comprising:

forming a third trench exposing the information storage portion and in the interlayer insulating film.

14. The method of claim 13, wherein the first trench and the second trench are formed after the forming of the third trench.

15. A method of fabricating a nonvolatile memory device, the method comprising:

forming a transistor in a first region of a substrate;

forming a contact connected to the transistor;

forming an insulated information storage-stop structure over the contact and the transistor by sequentially forming a base layer, at least one intermediate layer, and a top layer, wherein one of the base layer and the at least one intermediate layer includes a stop film covering the contact, and the other of the base layer and the at least one intermediate layer includes an information storage portion disposed two-dimensionally in a second region of the substrate, and the top layer includes an interlayer insulating film covering the contact and the information storage portion;

forming a first trench exposing the stop film, wherein the first trench is over the contact;

forming a second trench extending through the stop film to expose the contact; and forming a via in the second trench and contacting the contact, wherein the via and the stop film covering the contact have substantially the same height, and wherein a bottom surface of the second trench is lower than a bottom surface of the first trench.

16. The method of claim 15, wherein the stop film is included the base layer and covers the contact in the first region.

17. The method of claim 15, wherein the base layer includes the information storage portion, and a bottom surface of the first trench is lower than a bottom surface of the information storage portion.

18. The method of claim 15, further comprising:

forming a bit line in the first trench and contacting the stop film.

* * * * *